United States Patent [19]
Kowalski

[11] Patent Number: 5,512,852
[45] Date of Patent: Apr. 30, 1996

[54] AUTOMATIC TRIGGER CIRCUIT WITH FLOATING-GATE DETECTION TRANSISTOR

[75] Inventor: Jacek A. Kowalski, Trets, France

[73] Assignee: Gemplus Card International, Gemenos, France

[21] Appl. No.: 222,260

[22] Filed: Apr. 1, 1994

[30] Foreign Application Priority Data

Apr. 2, 1993 [FR] France ................................... 93 03934

[51] Int. Cl.[6] .................................................. H03K 3/037
[52] U.S. Cl. .............................. 327/206; 327/77; 327/89; 327/205
[58] Field of Search ..................................... 327/140, 141, 327/142, 143, 108, 109, 110, 111, 208, 51, 52, 63, 64, 65, 66, 77, 80, 81, 89, 205, 206, 207

[56] References Cited

U.S. PATENT DOCUMENTS

| | | | |
|---|---|---|---|
| 3,984,703 | 10/1976 | Jorgensen | 307/279 |
| 4,063,119 | 12/1977 | Odell et al. | 307/279 |
| 4,431,927 | 2/1984 | Eaton, Jr. et al. | 307/269 |
| 4,464,587 | 8/1984 | Suzuki et al. | 307/279 |
| 4,563,595 | 1/1986 | Bose | 307/290 |
| 4,571,504 | 2/1986 | Iwamoto et al. | 307/279 |
| 4,616,148 | 10/1986 | Ochii et al. | 307/530 |
| 4,703,201 | 10/1987 | McGrail | 307/290 |
| 4,827,450 | 5/1989 | Kowalski | 365/185 |
| 4,859,873 | 8/1989 | O'Shaughnessy et al. | 307/290 |
| 4,868,489 | 9/1989 | Kowalski | 324/61 |
| 4,881,199 | 11/1989 | Kowalski | 365/189.01 |
| 4,885,477 | 12/1989 | Bird et al. | 307/296.8 |
| 4,890,187 | 12/1989 | Kowalski et al. | 361/111 |
| 4,896,298 | 1/1990 | Kowalski | 365/189.01 |
| 4,904,884 | 2/1990 | O'Shaughnessy et al. | 307/290 |
| 4,916,333 | 4/1990 | Kowalski | 307/296.5 |
| 5,003,371 | 3/1991 | Kowalski et al. | 357/42 |
| 5,022,001 | 6/1991 | Kowalski et al. | 365/185 |
| 5,060,198 | 10/1991 | Kowalski | 365/201 |
| 5,060,261 | 10/1991 | Kowalski et al. | 380/3 |
| 5,097,146 | 3/1992 | Kowalski et al. | 307/305 |
| 5,148,395 | 9/1992 | Sowards | 365/185 |
| 5,180,929 | 1/1993 | Kokubun | 307/530 |
| 5,191,498 | 3/1993 | Kowalski | 361/1 |

FOREIGN PATENT DOCUMENTS

| | | |
|---|---|---|
| WO92/06451 | 4/1992 | France . |
| WO92/15074 | 9/1992 | France . |
| WO92/15096 | 9/1992 | France . |
| WO93/05513 | 3/1993 | France . |
| WO93/15477 | 8/1993 | France . |
| 3119923 | 2/1982 | Germany . |

Primary Examiner—John S. Heyman
Assistant Examiner—Kenneth B. Wells
Attorney, Agent, or Firm—Nilles & Nilles

[57] ABSTRACT

An automatic trigger circuit including: a two-arm current mirror including a first arm connected between a DC electrical supply and a ground, the first arm including a first transistor including a first source connected to the DC electrical supply, a first gate, and a first drain connected to the first gate; a second transistor including a second gate connected to the DC electrical supply, a second drain connected to the first drain and a second source; a third transistor including a third drain connected to the second source, a third gate for receiving a first level reference voltage, and a third source; and a fourth transistor including a fourth drain connected to the third source and a fourth source connected to the ground; and a second arm connected between the DC electrical supply and the ground, the second arm including a fifth transistor including a fifth source connected to the DC electrical supply, a fifth gate connected to the first gate and a fifth drain; and a sixth transistor including a sixth drain connected to the fifth drain, a sixth gate for receiving a second level reference voltage, and a sixth source connected to the fourth drain. The third transistor is a floating-gate detection transistor.

20 Claims, 3 Drawing Sheets

AUTOMATIC TRIGGER CIRCUIT WITH FLOATING-GATE DETECTION TRANSISTOR

BACKGROUND OF THE INVENTION

1. Field of the Invention

An object of the present invention is to provide an automatic trigger circuit, notably a resetting circuit that can be used in any electronic circuit. The invention is designed to be used particularly in the field of chip cards. However, it can be used in any field where the standards related to electrical supplies are likely to change because of technological improvements in electronic circuits.

2. Description of the Prior Art

Most of the integrated circuits used at present work with a supply voltage in the region of 5 volts plus or minus 10%. This is also true of circuits fop chip cards. However, in every field there is now a marked trend towards reducing this supply voltage, for example to about three volts or even less. It is stipulated, notably, that all circuits that can be used in portable microcomputers must be capable of operating at 3.3 volts. In the field of chip cards, the circuits should be capable of working at 5 volts as well as 3 volts or even at a lower voltage. This is because chip cards must be capable of being used by equipment supplied with power at 5 volts as well as by equipment supplied with power at 3 volts.

For all electronic circuits, notably for circuits used in chip cards, a factor of security needs to be taken into consideration. Indeed, a chip card must work accurately not only within a specified range of supply voltage but also outside this range in order to prevent any fraudulent individual for example from taking advantage of a malfunction outside this range to discover the secrets of the card and/or modify its memorized contents, for example by adding monetary units. To obtain protection against such attempts, most integrated circuits are fitted out with trigger circuits that inhibit the operation of the card beyond a certain range of voltage.

For example, for a circuit working at five volts, the bottom triggering voltage is located in the region of 3.5 volts and the top triggering voltage is in the region of 6.5 volts. These substantial margins, which correspond to values of more than +/− 10%, are maintained for two reasons:

these triggering thresholds depend on the manufacturing parameters of the integrated circuit and hence vary from production batch to production batch;

these thresholds are often depend greatly on the temperature: hence, to meet the specification of operation at 5 volts +/− 10%, a substantial margin must be applied.

The problem arises even more acutely when the voltage has to be lowered. For example to have an electronic circuit that is functional between 2.5 volts and 6 volts, it would be necessary to choose triggering thresholds of about two volts and seven volts. However, with the temperature and with the changes in manufacturing parameters, these thresholds may themselves vary between 1.5 and 2.5 volts, and between 6 volts and 8 volts.

For high voltages, the problem is less important because, in general, an electronic integrated circuit, or a chip works, well as at six volts as at eight volts. On the contrary, for the low voltages, the circuits do not work well at such as, for example 1.5 volts, and it is then possible to indulge in fraudulent behavior by using certain components and taking advantage of their malfunctioning at low voltage. This problem makes it very difficult to design a circuit for chip cards that is reliable and proof against fraud for supply voltages of less than three volts.

The aim of the invention, therefore, is to provide a trigger circuit that is stable in terms of threshold voltage and can be adjusted, for example, at the start of the life of the electronic component, notably duping a test on this component. This would firstly enable the elimination of the dependence of the triggering voltage on the parameters of the manufactured batch, the temperature and the supply voltage and secondly make it possible to have an adjustable triggering voltage.

The invention overcomes the above-mentioned drawbacks by proposing the use of a differential amplifier having at least one of its branches cascade-mounted with a cell comprising an EEPROM type electrically erasable and programmable floating-gate transistor. The idea lies in the storage, in the floating gate of a transistor of an EEPROM cell such as this, of the electrical charges corresponding to a reference voltage which will be used to determine the triggering threshold of the circuit. Thus, this voltage can easily be set between 0 and 5 volts with high precision. Since the triggering threshold is adjusted during a test on the circuit at the time of its manufacture, dependence on the parameters of the manufacturing method is completely eliminated. The independence of the threshold with respect to variations between production batches and with respect to variations in temperature and supply voltage is obtained by the differential circuit. Another cell of the same type is mounted in the other arm of this circuit. In practice, the difference between the triggering thresholds is compared with a voltage to be monitored.

SUMMARY OF THE INVENTION

An object of the invention, therefore, is an automatic trigger circuit, notably for the automatic triggering of a reset operation, comprising a voltage comparator that receives a first level of reference voltage to be monitored with respect to a second level of reference voltage and produces a variation in an output signal when a voltage difference to be monitored crosses a threshold, wherein said circuit comprises:

a two-arm current mirror, this mirror being connected between a DC electrical supply and a ground, each arm comprising a current adjusting transistor, these two transistors being mounted together in a mirror assembly;

a detection transistor in each of the arms, downline with respect to the adjusting transistors, at least one of these detection transistors being a floating-gate transistor, the two arms being joined, downline with respect to the two transistors, to a ground-connection transistor.

BRIEF DESCRIPTION OF THE DRAWINGS

The invention will be understood more clearly from the following description and from the accompanying figures which are given purely by way of an indication and in no way restrict the scope of the invention.

Of these figures.

MORE DETAILED DESCRIPTION

Figure 1:
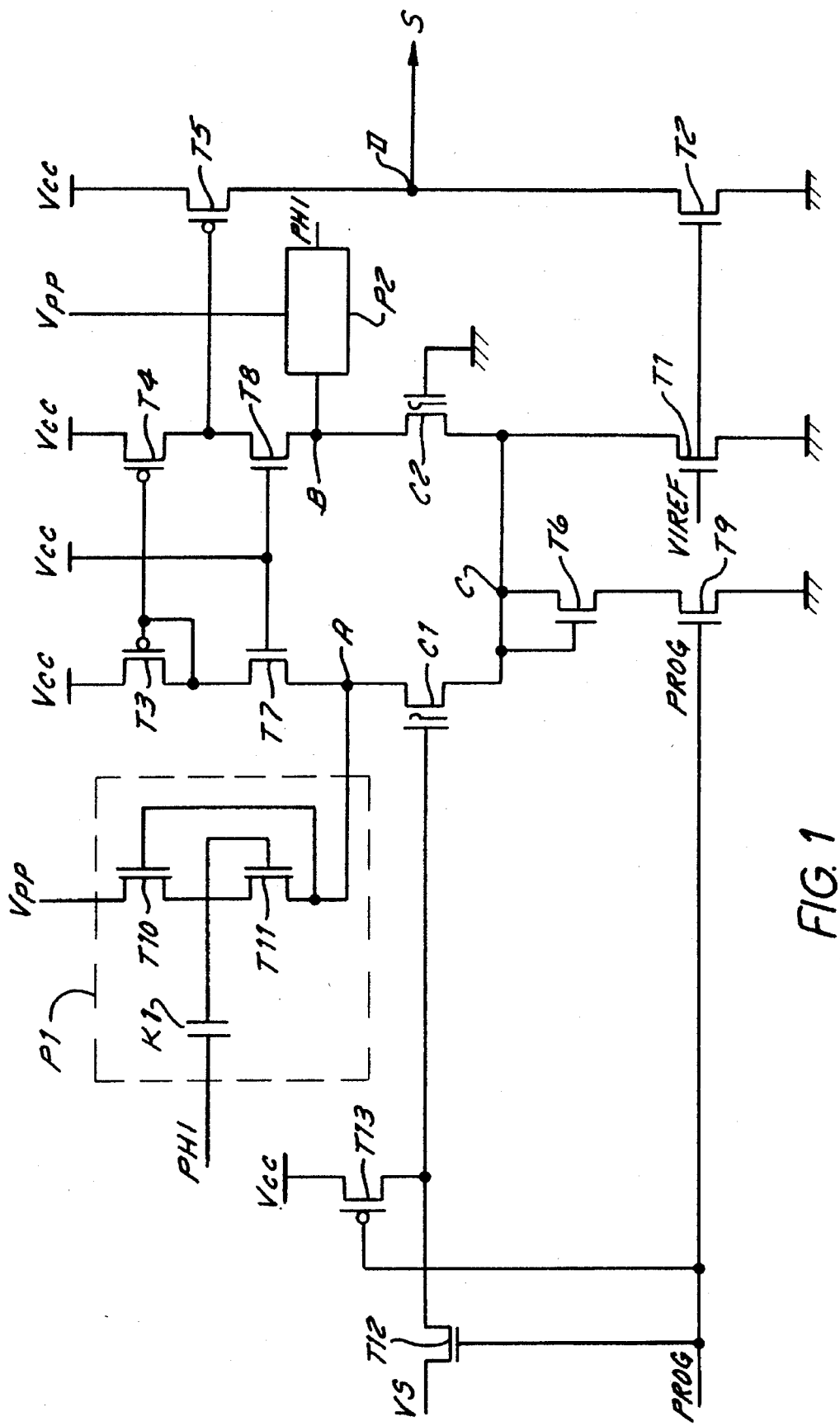
FIG. 1 is a diagram of a trigger circuit according to the invention.

FIG. 1 shows an automatic trigger circuit according to the invention. This circuit comprises a differential amplifier comparator which herein takes the form of a two-arm current mirror. In each of the arms, this mirror has a transistor, respectively T3 and T4. These transistors T3 and T4, which are P type transistors for example, have their source connected to a supply Vcc and their drain connected, further downline, to the ground. These transistors T3 and T4 are transistors for adjusting the current in each arm. They are mounted in a mirror assembly. In practice, the gate of the transistor T3 is connected to the drain of the transistor T3 and to the gate of the transistor T4. Detection transistors, C1 and C2 respectively, have been connected in each of the arms, downline with respect to the adjusting transistors T3 and T4. At least one of these detection transistors, the transistor C1, is a floating-gate transistor. The transistors C1 and C2 are N type transistors. They have their drains connected to the drains of the transistors T3 and T4, at nodes A and B respectively, and their sources connected together, at a node C, to the drain of an N type ground-connection transistor T1. The gate of the detection transistor C1 is connected to the voltage to be monitored, for example the voltage Vcc. The gate Of the transistor C2 is connected to another reference Voltage, for example the ground. The voltage monitored is the difference in voltage between these two reference voltages.

The transistors C1 and C2 are EEPROM type electrically erasable and programmable transistors. They have different conduction thresholds. The conduction threshold of the transistor C1 is equal, for example, to a voltage Vs-Vt. The conduction threshold of the transistor C2 is equal to −Vt. The detector thus designed is tripped whenever the difference in voltage to be monitored (in this case Vet in relation to the ground) crosses a level of reference voltage equal to the difference between the detection thresholds of the two transistors C1 and C2: this means that Vs, Vt is a conduction threshold of an enhanced normal transistor; the value of Vt is equal to 0.5 to 1 volt depending of the chosen technology of implantation.

The drain of the transistor T4 is also connected to the gate of a P type transistor T5 which is itself also connected between Vcc and the ground, in a cascade connection with an N type transistor T2. The N type transistors T1 and T2 receive, at their gate, a potential called VIRef which, in practice, is equal to about 1 volt. The value of this potential VIRef does not greatly affect the operation of the circuit and, furthermore, makes it possible to set up a low reference current in the circuit in order to limit its consumption. At midpoint, at the node D, between the drains of the transistors T5 and T2, an output signal S is picked up. This output signal S gets switched over when the voltage to be monitored crosses the threshold Vs.

Figure 2A:
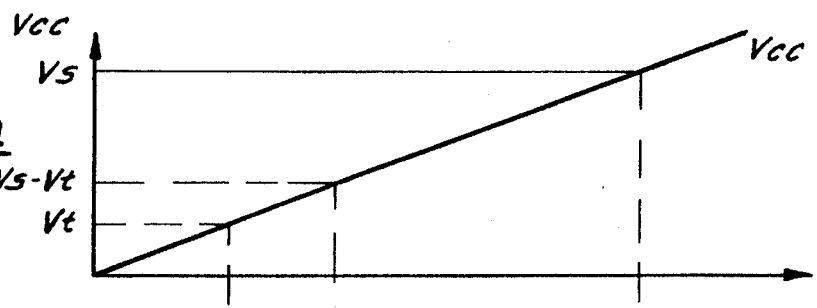
FIGS. 2a to 2e and 3a to 3d show timing diagrams of electrical signals that are used to program the circuit of the invention and that vary as a function of time.
Figure 2B:
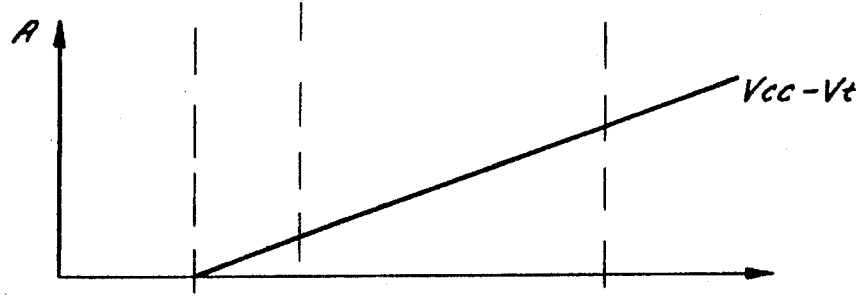
Figure 2C:
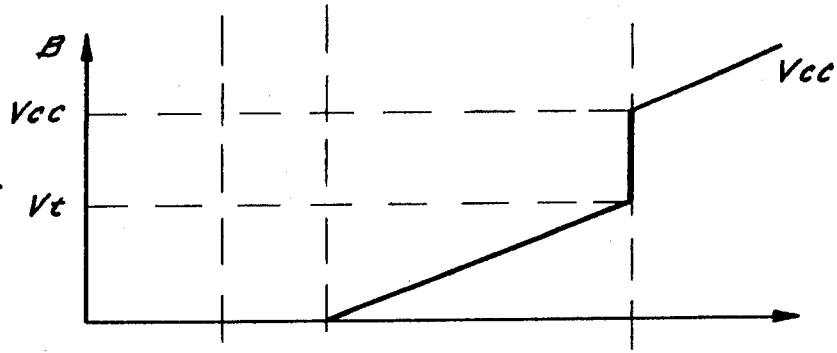
Figure 2D:
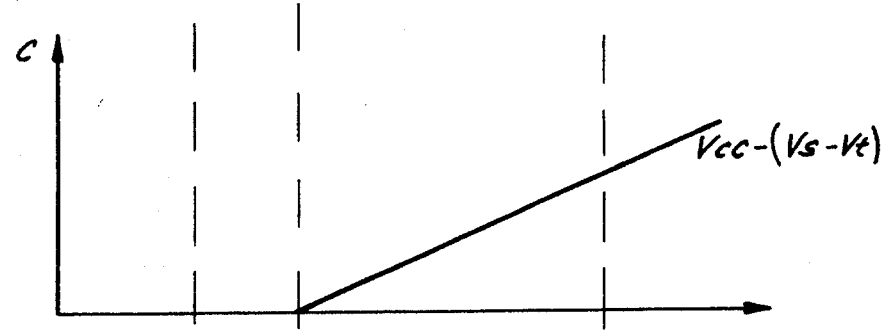
Figure 2E:
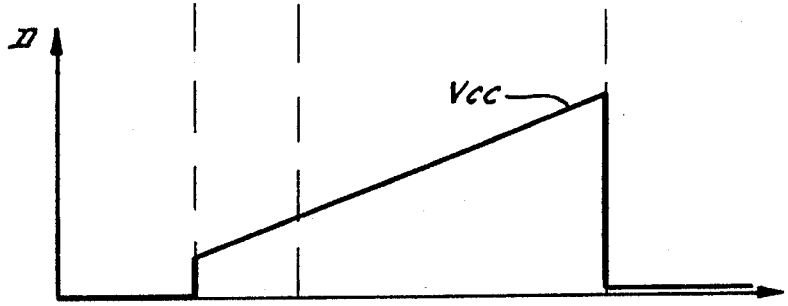

The circuit works as follows in detection mode. So long as the voltage to be monitored, in this case the supply voltage Vcc which is supplied to the mirror T4, is lower than Vs, the transistors T3 and T4 are off. Indeed (see FIGS. 2a to 2e), when the voltage Vcc, which is close to zero volt, starts rising, the transistor C2 is on, at the conduction limit. Indeed, it has a negative conduction threshold −Vt. The P type transistors T3 and T4 are off because the voltage Vcc at the beginning is still below their conduction threshold which is of the order of Vt only. Under these conditions, the transistor C2 draws the potential of the node B to zero. The potential of the node B at zero makes the transistor T5 conductive as soon as Vcc becomes greater than Vt. As a result of this, the signal S at the node D then follows the variation of Vcc (FIG. 2e).

So long as the voltage Vcc, which is greater than Vt, remains below Vs-Vt, all the current of the transistor T1, which discharges the potential at the node B, goes through the transistor C2. The transistors T3 and T4 remain off, and the potential B is approximately at 0 volt for T4 is off. Under these conditions, the output S at the node D is equal to Vcc for T5 is conductive and the current flowing through T1 and T2 is very low (about 1 microampere), these transistors T1 and T2 being at the limit of conduction.

When the voltage Vcc becomes greater than Vs−Vt, the voltage at the node C rises. Indeed, in the current mirror, the transistor T3 dictates the current. Since, at the beginning, C1 was off, the transistor T3 could not let through any current: it was off. Hence, T4 was also off since its operation was dictated by T3. Under these conditions, the voltage at the node C was zero (FIG. 2d).

Since the voltage Vcc, applied to the control gate of gate of C1, rises to Vs−Vt, C1 will become conductive. It becomes conductive as soon as this applied voltage becomes higher than that of its threshold which is equal to Vs−Vt. As soon as C1 becomes conductive, T3 and T4 become conductive. However, the current given by T3 at this precise point in time is low for, firstly, this current is limited by T1 (at the conduction limit) and, secondly, the current flowing through T1 is constituted partly by the current flowing through C1 and partly by the current flowing through C2.

At the start of this process where C1 becomes conductive, the voltage Vgs−Vthreshold (Vgs is the gate-source voltage) of C1 is smaller than the voltage Vgs− Vthreshold of C2. This means that C2 is more conductive than C1. With the continuation of the increase in Vcc, this situation gets reversed. C2 is no longer conductive, and C1 is more conductive than C2. During the start of the conduction of C1, the voltage Vgs−Vthreshold of C1 will remain low. This means that the voltage at the node C will then start rising with Vcc, as also the voltage at the node B (FIGS. 2c and 2d).

At the time of the reversal, when Vcc is equal to Vs, C2 goes off and the voltages at the nodes A and C continue to rise. The voltage at the node B gets switched over because T4 is conductive and because there is no longer any element that draws the potential of B towards zero since C2 is off. The transistor C2 is off because although its conduction threshold is negative, the voltage at the point C has increased to such an extent that it becomes greater than this value in terms of absolute value.

If the conduction thresholds in the transistors C1 and C2 have been programmed accurately at the values indicated, then the output voltage S goes to zero as soon as the voltage of Vcc goes beyond Vs. Indeed, at this instant, the transistor C1 is subjected to a gate-source potential that is greater than the gate-source potential of the transistor C2. This is due to the fact that the gate-source potential of C2 becomes lower than −Vt with the increase in the potential of the node C.

This circuit is independent of the temperature and of the parameters of manufacture. This is due to the fact that the supply voltages change in the same way for the transistors C1 as for the transistors C2. There is obtained a detection voltage equal to:

$$(Vs-Vt+alpha)-(-Vy+alpha)$$

alpha representing an identical variation related to manufacturing, temperature or voltage.

The voltage Vs is memorized in the circuit during operations for testing the working of this circuit. It is memorized during a programming operation.

To program the two floating-gate transistors C1 and C2, the following procedure is preferably used. The nodes A and B are connected to charge pumps P1 and P2 respectively. The pump P1 is shown in detail in the figure. This pump P1 has a supply input for a programming potential Vpp and a clock input receiving a phase signal PHI. The pump P1 has two N type cascade-connected transistors T10 and T11, the drain of the transistor T10 being connected to a source of programming voltage Vpp, the source of this transistor T10 being connected to the drain of the transistor T11, the source of the transistor T11 constituting the output of the pump P1 and being furthermore connected to the gate of the transistor T10. The gate of the transistor T11 is connected to the midpoint between the transistors T10 and T11. The phase signal input is connected to this midpoint by means of a capacitor K1. To prevent the short-circuiting of the nodes A and B at the voltage Vcc during the programming, N type decoupling transistors T7 and T8 are interposed between these nodes and the transistors T3 and T4 respectively. At their control gates, these transistor T7 and T8 receive the supply voltage Vcc. So long as the transistors T7 and T8 have to transmit a positive potential received from the transistors T3 and T4, they are conductive. However, if the potentials at the nodes A and B become greater than Vcc, then these transistors go off since, in this case, their gates are at the same potential as their source.

Figure 3A:
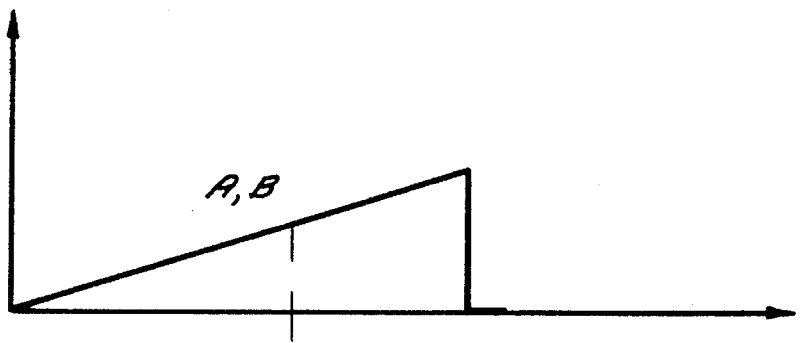
Figure 3B:
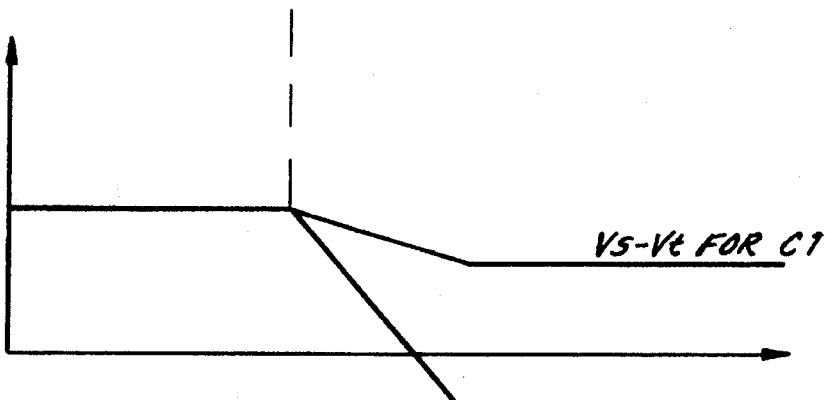
Figure 3C:
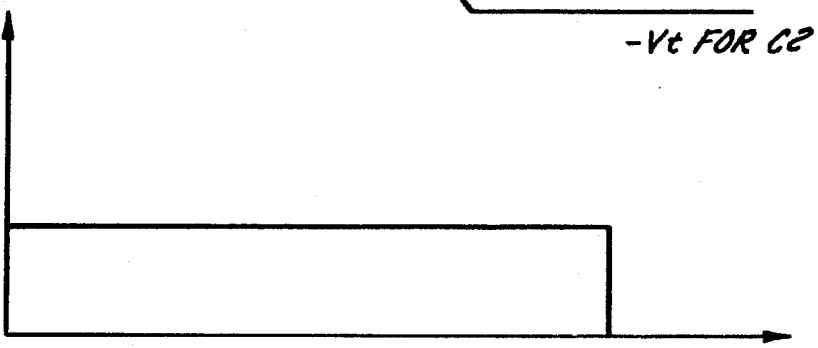
Figure 3D:
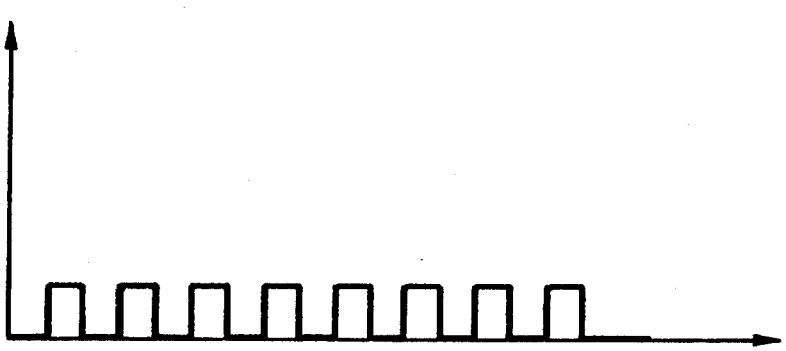

At each pulse (FIG. 3d) sent to the capacitor K1 by the clock, a small quantity of energy is sent to the node A and to the node B (FIG. 3a). At the time of the programming, the signal PROG is applied to the control gates of selection transistors which are respectively an N type transistor T12 and a P type transistor T13. A threshold voltage Vs is imposed on a terminal of the circuit. The transistor T12 is connected to this terminal. The transistor T13 receives the voltage to be monitored (Vcc) and transmits it to the gate of C1, The transistor T12, when it receives a positive signal PROG at its gate, sends the value of the threshold voltage Vs to the control gate of the floating-gate transistor C1. Under the same conditions of programming, the transistor T13 goes off. By contrast, outside of programming periods, the transistor T12 is off and the transistor T13 is short-circuited. The transistor C1 monitors the voltage that is applied to it and transmitted by the transistor T13: in this case, as it happens, the voltage Vcc.

During the programming, cascade-mounted N type transistors T6 and T9 are used to set up a bypass connection, to the ground, of the node C. The transistor T6 behaves like a diode. Preferably, its gate is connected to its drain. The transistor T9 receives the signal PROG at its control gate. The charge pumps P1 and P2 enable the application of the voltage Vpp to the nodes A and B during the programming of the device. As soon as PHI starts oscillating, an output voltage of these charge pumps rises to Vpp plus Vt. The advantage of these pumps arises out of the fact that, even if the potential at one of the nodes A or B were to fall sharply, there would be no excessive consumption of current since only the energy of the signal PHI is consumed.

At the start of the programming operation, the potentials of the nodes A and B, which are charged slowly by the charge pumps P1 and P2, rise (FIG. 3a). Each of the transistors C1 or C2 is normally in an erased state, for example with a threshold voltage equal to 6 volts. They then start getting programmed, for example firstly the transistor C2. The threshold voltage (FIG. 3b) of this transistor C2 starts getting modified because of the injection of the charges which in practice are holes, into the floating gate. When the threshold voltage of the concerned transistor, namely the transistor C2, reaches the required threshold (i.e. when these holes, by the electrical field that they impose, cause the conduction channel to become conductive), this transistor starts conducting and the programming stops. For C2, the requisite threshold is −Vt. This requisite threshold is obtained by the connection of the control gate of C2 to the ground. When the state of conduction arises, the threshold voltage of the transistor falls below its gate-source voltage Vthreshold< Vgs. In the case of C2, this gate-source voltage is equal to −Vt because T6 which is mounted as a diode obliges the potential of the node C to be equal to Vt: hence Vgs at the outset is equal to −Vt.

Since the concerned charge pump, the pump P2, tolerates no leakage current because of the small quantities of energy transmitted by each pulse of the signal PHI, the voltage at the concerned node, namely the node B, drops because of the conduction, and the programming stops. This is also the case for the node A and the programming of the threshold of the transistor C1 at Vs-Vt.

Thus, the system programs itself. It is enough to apply the reference voltage Vs to the gate of C1. In certain cases, both the transistors C1 and C2 must be erased before the programming. Indeed, sometimes, when they come off the production line, EEPROM type cells have threshold voltages below −Vt (these voltages may even reach −4 volts).

In a simpler mode of operation, the device may be replaced by another one that is slightly less precise. In this case, the transistor C2 may be replaced by a native transistor, namely a normal transistor without a floating gate, whose conduction threshold of the order of 0 volts is adjusted during manufacture by eliminating the step for injecting impurities into its conduction channel. In a device such as this, there would be only one EEPROM detection cell. This device then gets triggered at Vcc= Vs. However, this device is less precise because the threshold voltages of the two transistors C1 and C2 then do not change in the same way as a function of the temperature. With a device simplified in this way, a variation of the order of 0.2 to 0.3 volts can be observed in terms of the tolerance of the value of the triggering voltage as a function of the temperature.

The device described here above can be used to resolve the problems pertaining to the choice of the triggering voltages internal to a circuit. Furthermore, this circuit is independent of the parameters of the manufacturing method as well as of the temperature. The proposed approach can be used to meet the requirements of every type of circuit, notably for chip cards. Furthermore, it has the advantage of having very low consumption of less than one microampere and can therefore also be applied to all low-consumption circuits.

The stability of the device depends on the ability of the transistors C1 or C2 to retain charges at the floating gates. Indeed, the charges stored at a floating-gate of an EEPROM cell may leak slightly. Measurements have been made on existing cells. These measurements show that the change in the threshold voltage of an EEPROM cell is of the order of 0.2 volts in 10 years. This is therefore the margin to be taken with respect to the triggering voltage desired when the device is being programmed.

The signal S is then exploited in the circuit, for example in order to neutralize its operation.

What is claimed is:

1. An automatic trigger circuit having a voltage comparator that a) receives a first level reference voltage that is to be monitored with respect to a second level reference voltage and b) produces a variation in an output signal on an output node when a voltage difference between said first and second level reference voltages exceeds a threshold, said automatic trigger circuit comprising: a two-arm current mirror including I a first arm connected between a DC electrical supply and a ground, said first arm including
   A a first transistor including a first source connected to said DC electrical supply, a first gate, and a first drain connected to said first gate;
   B a second transistor including a second gate connected to said DC electrical supply, a second drain connected to said first drain and a second source;
   C a third transistor including a third drain connected to said second source, a third gate for receiving said first level reference voltage, and a third source; and
   D a fourth transistor including a fourth drain connected to said third source and a fourth source connected to said ground; and
II a second arm connected between said DC electrical supply and said ground, said second arm including
   A a fifth transistor including a fifth source connected to said DC electrical supply, a fifth gate connected to said first gate and a fifth drain; and
   B a sixth transistor including a sixth drain connected to said fifth drain, a sixth gate for receiving said second level reference voltage, and a sixth source connected to said fourth drain,
wherein said third transistor is a floating-gate detection transistor.

2. The automatic trigger circuit according to claim 1, wherein
   a) said sixth transistor is a floating-gate detection transistor,
   b) a difference between i) a conduction threshold of said third transistor and ii) a conduction threshold of said sixth transistor is equal to said voltage difference between said first and second level reference voltages and
   c) said automatic trigger circuit functions substantially independent of temperature and substantially independent of supply voltage.

3. The automatic trigger circuit according to claim 2, further comprising:
   a first charge pump connected to said third drain; and
   a second charge pump connected to said sixth drain,
   wherein said first charge pump and said second charge pump have current throughput that is limited for programming of said third transistor and said sixth transistor.

4. The automatic trigger circuit according to claim 3, further comprising:
   a first circuit for applying a first reference potential to said third gate;
   a second circuit for applying a second reference potential to said sixth gate; and
   a third circuit for simultaneously programming both said third transistor and said sixth transistor.

5. The automatic trigger circuit according to claim 1, wherein said third transistor is an electrically erasable programmable read only memory transistor and said sixth transistor is an electrically erasable programmable read only memory transistor.

6. The automatic trigger circuit according to claim 2, wherein said third transistor is an electrically erasable programmable read only memory transistor and said sixth transistor is an electrically erasable programmable read only memory transistor.

7. The automatic trigger circuit according to claim 3, wherein said third transistor is an electrically erasable programmable read only memory transistor and said sixth transistor is an electrically erasable programmable read only memory transistor.

8. The automatic trigger circuit according to claim 4, wherein said third transistor is an electrically erasable programmable read only memory transistor and said sixth transistor is an electrically erasable programmable read only memory transistor.

9. An automatic trigger circuit having a voltage comparator that a) receives a first level reference voltage that is to be monitored with respect to a second level reference voltage and b) produces a variation in an output signal on an output node when a voltage difference between said first and second level reference voltages exceeds a threshold, said automatic trigger circuit comprising:
a two-arm current mirror including
I a first arm connected between a DC electrical supply and a ground, said first arm including
   A a first transistor including a first source connected to said DC electrical supply, a first gate, and a first drain connected to said first gate;
   B a second transistor including a second gate connected to said DC electrical supply, a second drain connected to said first drain and a second source;
   C a third transistor including a third drain connected to said second source, a third gate for receiving said first level reference voltage, and a third source; and
   D a fourth transistor including a fourth drain connected to said third source and a fourth gate connected to said ground; and
II a second arm connected between said DC electrical supply and said ground, said second arm including
   A a fifth transistor including a fifth source connected to said DC electrical supply, a fifth gate connected to said first gate and a fifth drain; and
   B a sixth transistor including a sixth drain connected to said fifth drain, a sixth gate for receiving said second level reference voltage, and a sixth source connected to said fourth drain;
a first circuit for applying said first reference level potential to said third gate;
a second circuit for applying said second reference level potential to said sixth gate; and
a third circuit for simultaneously programming both said third transistor and said sixth transistor,
wherein said third transistor is a floating-gate detection transistor.

10. The automatic trigger circuit according to claim 9, wherein
   a) said sixth transistor is a floating-gate detection transistor,
   b) a difference between i) a conduction threshold of said third transistor and ii) a conduction threshold of said sixth transistor is equal to said voltage difference between said first and second level reference voltages and
   c) said automatic trigger circuit functions substantially independent of temperature and substantially independent of supply voltage.

11. The automatic trigger circuit according to claim 9, wherein said third transistor is an electrically erasable programmable read only memory transistor and said sixth transistor is an electrically erasable programmable read only memory transistor.

12. The automatic trigger circuit according to claim 10, wherein said third transistor is an electrically erasable programmable read only memory transistor and said sixth transistor is an electrically erasable programmable read only memory transistor.

13. A chip card comprising: an automatic trigger circuit having a voltage comparator that a) receives a first level reference voltage that is to be monitored with respect to a second level reference voltage and b) produces a variation in an output signal on an output node when a voltage difference between said first and second level reference voltages exceeds a threshold, said automatic trigger circuit including a two-arm current mirror including I a first arm connected between a DC electrical supply and a ground, said first arm including A a first transistor including a first source connected to said DC electrical supply, a first gate, and a first drain connected to said first gate;

B a second transistor including a second gate connected to said DC electrical supply, a second drain connected to said first drain and a second source;

C a third transistor including a third drain connected to said second source, a third gate for receiving said first level reference voltage, and a third source; and D a fourth transistor including a fourth drain connected to said third source and a fourth source connected to said ground; and II a second arm connected between said DC electrical supply and said ground, said second arm including A a fifth transistor including a fifth source connected to said DC electrical supply, a fifth gate connected to said first gate and a fifth drain; and B a sixth transistor including a sixth drain connected to said fifth drain, a sixth gate for receiving said second level reference voltage, and a sixth source connected to said fourth drain;

wherein said third transistor is a floating-gate detection transistor.

14. The chip card according to claim 13, wherein a) said sixth transistor is a floating-gate detection transistor, b) a difference between i) a conduction threshold of said third transistor and ii) a conduction threshold of said sixth transistor is equal to said voltage difference between said first and second level reference voltages and c) said automatic trigger circuit functions substantially independent of temperature and substantially independent of supply voltage.

15. The chip card according to claim 14, further comprising:

a first charge pump connected to said third drain; and a second charge pump connected to said sixth drain, wherein i) said first charge pump and said second charge pump have current throughput that is limited for programming of said third transistor and said sixth transistor.

16. The chip card according to claim 15, further comprising:

a first circuit for applying a first reference potential to said third gate;

a second circuit for applying a second reference potential to said sixth gate; and a third circuit for simultaneously programming both said third transistor and said sixth transistor.

17. The chip card according to claim 13, wherein said third transistor is an electrically erasable programmable read only memory transistor and said sixth transistor is an electrically erasable programmable read only memory transistor.

18. The chip card according to claim 14, wherein said third transistor is an electrically erasable programmable read only memory transistor and said sixth transistor is an electrically erasable programmable read only memory transistor.

19. The chip card according to claim 15, wherein said third transistor is an electrically erasable programmable read only memory transistor and said sixth transistor is an electrically erasable programmable read only memory transistor.

20. The chip card according to claim 16, wherein said third transistor is an electrically erasable programmable read only memory transistor and said sixth transistor is an electrically erasable programmable read only memory transistor.

\* \* \* \* \*